(12) United States Patent
Gilleo

(10) Patent No.: US 6,265,776 B1
(45) Date of Patent: Jul. 24, 2001

(54) FLIP CHIP WITH INTEGRATED FLUX AND UNDERFILL

(75) Inventor: Ken Gilleo, Chepachet, RI (US)

(73) Assignee: Fry's Metals, Inc., Jersey City, NJ (US)

(*) Notice: Subject to any disclaimer, the term of this patent is extended or adjusted under 35 U.S.C. 154(b) by 0 days.

(21) Appl. No.: 09/067,381

(22) Filed: Apr. 27, 1998

(51) Int. Cl.[7] .................. H01L 23/48; H01L 23/52; H01L 29/40
(52) U.S. Cl. .................. 257/738; 438/613; 438/108; 438/118; 257/737; 257/783; 257/778; 228/180.22
(58) Field of Search .................. 257/738, 737, 257/778, 779, 783, 787, 792–794; 228/180.22; 438/613, 108, 118

(56) References Cited

U.S. PATENT DOCUMENTS

| | | | |
|---|---|---|---|
| 5,128,746 | 7/1992 | Pennisi | 257/778 |
| 5,371,404 | * 12/1994 | Juskey et al. | 257/778 |
| 5,543,585 | * 8/1996 | Booth et al. | 174/261 |
| 5,641,996 | * 6/1997 | Omoya et al. | 257/787 |
| 5,729,440 | * 3/1998 | Jimarey et al. | 257/778 |

FOREIGN PATENT DOCUMENTS

| | | |
|---|---|---|
| 0853337 | * 7/1998 | (EP) . |
| 853 337 | 7/1998 | (EP) . |
| 98/02919 | * 1/1998 | (WO) . |
| WO 98/02919 | 1/1998 | (WO) . |
| WO 99/04430 | 1/1999 | (WO) . |

OTHER PUBLICATIONS

Patent Abstract of Japan, vol. 014, No. 546 (E–1008), Dec. 1990.*
JP 02 23444 A (NEC Corp.), Sep. 1990.*
Patent Abstract of Japan, vol. 015, No. 125 (E–1050), Mar. 1991.*
JP 03 012942 A (Sharp Corp., Jan. 1991.*
Patent Abstracts of Japan, vol. 014, No. 546 (E–1008), Dec. 4, 1990 and JP 02 234447 A (NEC Corp..) Sep. 17, 1990 abstract.
Patent Abstracts of Japan, vol. 015, No. 125 (E–1050), Mar. 27, 1991 & JP 03 012942 A Sharp Corp., Jan. 21, 1991 abstract.

* cited by examiner

Primary Examiner—Eddie C. Lee
Assistant Examiner—Jhihan B. Clark
(74) Attorney, Agent, or Firm—Mintz, Levin, Cohn, Ferris, Glovsky and Popeo, P.C.

(57) ABSTRACT

A flip chip having solder bumps, an integrated underfill, and a separate flux coating, as well as methods for making such a device, is described. The resulting device is well suited for a simple one-step application to a printed circuit board, thereby simplifying flip chip manufacturing processes which heretofore have required a separate underfilling step.

12 Claims, 2 Drawing Sheets

FLIP CHIP WITH INTEGRATED FLUX AND UNDERFILL

FIELD OF THE INVENTION

The present invention relates to a novel flip chip design. More particularly, the present invention relates to a flip chip which incorporates solder bumps, flux and an underflow material.

BACKGROUND OF THE INVENTION

In the electronics industry, electrical components such as resisters, capacitors, inductors, transistors, integrated circuits, chip carriers and the like are typically mounted on circuit boards in one of two ways. In the first way, the components are mounted on one side of the board and leads from the components extend through holes in the board and are soldered on the opposite side of the board. In the second way, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. One family of surface-mounted devices, referred to as "flip chips", comprises integrated circuit devices having numerous connecting leads attached to pads mounted on the underside of the device. In connection with the use of flip chips, either the circuit board or the chip is provided with small bumps or balls of solder (hereafter "bumps" or "solder bumps") positioned in locations which correspond to the pads on the underside of each chip and on the surface of the circuit board. The chip is mounted by (a) placing it in contact with the board such that the solder bumps become sandwiched between the pads on the board and the corresponding pads on the chip; (b) heating the assembly to a point at which the solder is caused to reflow (i.e., melt); and (c) cooling the assembly. Upon cooling, the solder hardens, thereby mounting the flip chip to the board's surface. Tolerances in devices using flip chip technology are critical, as the spacing between individual devices as well as the spacing between the chip and the board is typically very small. For example, spacing of such chips from the surface of the board is typically in the range of 0.5–3.0 mil and is expected to approach micron spacing in the near future.

One problem associated with flip chip technology is that the chips, the solder and the material forming the circuit board often have significantly different coefficients of thermal expansion. As a result, differing expansions as the assembly heats during use can cause severe stresses, i.e., thermomechanical fatigue, at the chip connections and can lead to failures which degrade device performance or incapacitate the device entirely.

In order to minimize thermomechanical fatigue resulting from different thermal expansions, thermoset epoxies have been used. Specifically, these epoxies are used as an underflow material which surrounds the periphery of the flip chip and occupies the space beneath the chip between the underside of the chip and the board which is not occupied by solder. Such epoxy systems provide a level of protection by forming a physical barrier which resists or reduces different expansions among the components of the device.

Improved underflow materials have been developed in which the epoxy thermoset material is provided with a silica powder filler. By varying the amount of filler material, it is possible to cause the coefficient of thermal expansion of the filled epoxy thermoset to match that of the solder. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for flip chips on printed circuit boards, it has created significant difficulties in the manufacturing process. For example, the underfill must be applied off-line using special equipment. Typically, the underfill is applied to up to three edges of the assembled flip chip and allowed to flow all the way under the chip. Once the material has flowed to opposite edges and all air has been displaced from under the chip, additional underfill is dispensed to the outer edges so as to form a fillet making all four edges symmetrical. This improves reliability and appearance. Next, the assembly is baked in an oven to harden the underfill. This process, which may take up to several hours, is necessary to harden and fully cure the underfill. Thus, although the underfill solves the thermal mismatch problem and provides a commercially viable solution, a simpler manufacturing method would be desirable.

Recently, attempts have been made to improve and streamline the underfill process. One method that has shown some commercial potential involves dispensing underfill before assembling the flip chip to the board. This method requires that the underfill allow solder joint formation to occur. Soldering of flip chips to printed circuit boards is generally accomplished by applying flux to the solder bumps on the flip chip or to the circuit pads on the printed circuit board. Thus, it has been suggested to use an underfill that is dispensed first, prior to making solder connections. In order to facilitate solder bonding, however, the underfill must contain flux or have inherent properties that facilitate solder joint formation. Flux is used since the pads on printed circuit boards often oxidize, and since solder bumps on flip chips are always oxidized. Thus, the flux is designed to remove the oxide layers facilitating solder joint formation.

Certain underfills commonly called "dispense first underfills" have been designed with self-contained flux chemistry. Unfortunately, the properties required for a good flux and those required for a good underfill are not totally compatible. As such, a compromise of properties results. The best flux/underfill materials typically require more than an hour to harden. Additionally, flux-containing underfills still require the use of special equipment including robot dispensing machines. Also, since solder assembly and underfill application are combined into a single step, the flip chip cannot be tested until the assembly is complete. Thus, if the chip does not operate satisfactorily, it cannot be removed because the underfill will have hardened, thereby preventing reworking. In view of the above, a need still exists for a more efficient process that reduces the need for expensive equipment and that is compatible with existing electronic device assembly lines. A need for a reworkable underfll exists as well.

SUMMARY OF THE INVENTION

The present invention relates to an integrated circuit assembly comprising a semiconductor wafer which includes solder bumps, flux, and an underfill material. In a broad sense, the invention relates to an integrated circuit assembly which includes a substrate having a plurality of solderable contact sites on one surface and a plurality of solder bumps positioned on that surface such that each of the solderable contact sites has one solder bump associated with and affixed to each solderable contact site. Each site further includes a flux material which covers at least a portion of each solder bump and an underfill material which occupies the space defined between each of the solder bumps. The underfill material is of a depth such that at least a flux covered portion of each solder bump extends above the underfill.

The present invention also relates to a method for making an integrated circuit assembly which includes the steps of providing a substrate having a plurality of solderable contact sites on a surface thereof, positioning a plurality of solder bumps on the substrate such that each of the solderable contact sites has one solder bump associated with it, and affixing each solder bump to its associated contact site. Once the solder bumps are mounted, a flux material is applied to the solder bumps in a manner such that at least a portion of each solder bump is provided with flux. Finally, an underfill material is applied to the surface of the substrate. The underfill occupies the space defined between each of the solder bumps and has a depth such that at least a flux covered portion of each solder bump extends through the underfill.

Lastly, the invention relates to a process for affixing a flip chip to a circuit board. The method involves providing a printed circuit board having a plurality of solderable contact sites on a surface, providing an integrated circuit chip of the type described above (i.e., a chip having solder bumps, flux and an underfill material present on its surface), and positioning the integrated circuit chip relative to the printed circuit board such that each solder bump is in contact with a solderable contact site on the printed circuit board. Once positioned, the integrated circuit chip assembly is heated to a temperature sufficiently high to melt the solder and the underfill material. Subsequently, the assembly is allowed to cool to a temperature which allows the solder and underfill material to solidify.

DETAILED DESCRIPTION OF THE INVENTION

Figure 1:
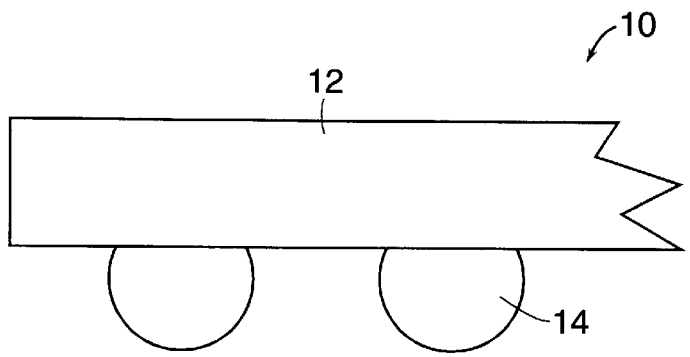
FIG. 1 is a schematic elevation of a wafer having solder bumps thereon.

The present invention provides a unique method of applying fluxes and underfills during the flip chip mounting process. Specifically, the present invention relates to the application of underfill and flux at the wafer level before the wafer is divided into individual integrated circuits. Thus, in the present invention the underfill and flux are pre-applied and converted into a solid state. This process differs from other types of underfill application processes in which the underfill is present in the liquid state and then applied to the device at the point of chip assembly to the printed circuit board. Additionally, the underfill and the flux are separated, rather than being mixed as a combined flux/underfill composition. As noted previously, liquid systems combine the flux and underfill systems into a single composition and, thus, provide neither flux nor underfill having ideal properties.

The present invention recognizes that flux is required only at the areas of the solder bumps, and not in the spaces in between those connecting elements. Thus, the present invention separates the flux from the underfill in the regions between the solder bumps. Furthermore, by maintaining the flux and underfill as separate entities, additives tailored to each individual component may be added to provide both the flux and the underfill with desired properties. For example, the underfill can be a thermoplastic that de-bonds at elevated temperatures, or the flux layer can be designed to de-bond. As an alternative, the flux can convert to a strongly-bonded polymer after its mission as a flux has been accomplished, and the underfill can have the de-bonding properties. As such, a system in which the flux and underfill are maintained as separate entities is extremely versatile.

Likewise, an alternative embodiment employs the use of an underfill only. In such a case, there would be a requirement that flux be added separately to the board or to the flip chip using any of the wide variety of processes that are currently in commercial use. Although an additional fluxing step would be required, the use of an underfill-only embodiment would still eliminate the necessity for the underfill process after the chip is mounted, while allowing the use of standard electronic component assembly equipment.

In one embodiment, the invention comprises the application of a layer of hardenable underfill to a bumped wafer followed by drying or hardening. The underfill material is preferably a thermoplastic or a thermoset having a very low crosslink density. In either case, the underfill material is filled with a low expansion inorganic particulate material such as silica. The resulting underfill should preferably have a coefficient of thermal expansion (CTE) that approximates that of the solder joint or other joining material. In the case of eutectic solder joints, the CTE should range from approximately twenty to thirty parts per million per °C. It is preferred that the resin system is soluble in a safe solvent system to allow the resin to be coated as a liquid in a viscosity range suitable for wafer-coating methods. Although a dry polymer film or powder could be coated onto the wafer by melting, a liquid is preferred because of the availability of wafer dispensing and coating equipment adapted to liquid handling processes. Additionally, this embodiment includes a layer of flux that is designed to be compatible with flip-chip assembly and underfills.

One such flux system includes epoxy resins and an organic carboxylic acid, an anhydride or a combination thereof, and is commercially available from Alpha Metals Jersey City, N.J. under the trade name ChipFlux 2020. This material is an anhydride system which, upon heating, converts to carboxylic acid. Although this material is a paste made with liquid epoxy resins, the system can be readily modified for use in the present invention. For example, solid epoxy resins having slightly higher molecular weight than liquid epoxies can be substituted and used with carboxylic acid as the flux. Even with solid epoxy resins and carboxylic acid (which is a solid at room temperature), the system can easily be dissolved in polar solvents and can then be coated in a liquid state and dried to a solid film. Although the preferred flux application methods are spin coating, spraying, or stencilling, the wafer can also be coated using a dipping process in which the bump side of the wafer is pressed against a thin layer of flux on a dispensing drum consisting of a rotating platen disk and a doctor blade (described below) to control the liquid thickness.

Flip chips having integrated underfill and flux can be mounted on a printed circuit board as follows. An individual flip chip, with integrated underfill and flux, is placed in contact with the circuit board in a manner such that the solder bumps are aligned with conductive pads printed on the board. The assembly is then passed to a multi-zone re-flow soldering oven. The application of heat causes the flux to melt and activate. For applications using the solid ChipFlux 2020 described above and used in tests, the material is heated to about 80° C., however, the useful range is about 40° C. to about 100° C. The activated flux removes oxide on the solder bumps as well as on the circuit board. As heating is continued to higher temperatures (typically by moving the assembly into a higher temperature zone of the oven), the solder bumps are caused to melt and form a metallurgical joint between the flip chip and the printed circuit board. At that elevated temperature, the flux becomes deactivated. For example, in the case of a carboxylic acid/ epoxy flux system, the elevated temperature causes the acid to chemically combine with the epoxy and become neutralized so that there will be no tendency toward corrosion. Such fluxes are called "no clean" fluxes. These fluxes are typically heated to about 190° C. to about 220° C., however, the lower end of the temperature range is preferred since the flux does most of its work at solder reflow temperatures. The flux deactivation process also tends to harden the flux and create a strong bond to the printed circuit board. Such a bond is very desirable, and results because the typical printed circuit board is made with epoxy, thereby enhancing the ability of the similar epoxy-based flux to bond to the board.

Since the flux and underfill are contained in separate layers in the devices of the present invention, it is not essential, although it is preferred, that the underfill layer melt. The underfill must soften and preferably melt so that it will wet out and bond to the circuit substrate. Since the maximum soldering temperature for common eutectic solder is about 220–225° C., the underfill will have softened and/or melted upon reaching this temperature. However, in the case where a higher melting underfill is needed, bonding can take place at the softening point if downward force is applied. It is preferred that only about half of the original bump height be covered with underfill since it is expected that the bump would typically collapse to about half of its original height as the solder wets the conductive pad on the printed circuit board and forms the joint.

After the solder has melted, the assembly is allowed to cool, thereby allowing the solder to harden and to form a solid metallurgical joint between the flip chip and the board. The resulting assembly is protected from thermomechanical strain by the underfill and flux layers. In one preferred embodiment, the flux may assume underfill properties as the result of polymerization.

The flux can be made into an underfill-like material by adding a sufficient low-expansion filler such as silica. It has been recognized that the flux polymerizes during the solder reflux process to a thermoplastic state. This means that the underfill and the flux can be reworked by heating the chip above solder reflow (i.e., about 200° C.). This also means that any flux residue can be removed by a polar solvent if necessary. That result is optional, however, because most of the firm solder joint would be encased in the underfill composition which serves to provide optimum protective properties to the joint.

Alternatively, a standard flip chip bonder that can apply heat and pressure can be employed instead of the reflow oven. In that embodiment, the flip chip coated with the flux and underfill is placed into contact with the conductive pads on the circuit board and heat from the bonder head will activate the flux, form joints by reflowing the solder bumps, and cause the underfill and flux system to bond tightly to the board. The use of a standard flip chip bonder would allow a flip chip to be assembled to a board that already contained mounted components. This method could also be used to assemble a chip at a site that is being reworked.

Reworking is desirable in situations in which a chip mounting step has failed to properly position the chip on the board. Specifically, the assembly of fine pitch, high-density components can result in misalignments and failed connections. Furthermore, since it is difficult to fully test an unpackaged device such as a flip chip, it becomes desirable to be able to remove the chip if final testing indicates that the chip is not operating optimally, either through a fault with the chip or as a result of improper mounting. Thermoset underfills do not allow the assembly to be reworked since thermosets cannot be melted once they have crosslinked.

The present invention eliminates the problems associated with thermoset underfills by incorporating a thermoplastic resin as the main component of the underfill. Thus, the chip can be removed by raising the chip temperature to above the melting point of the solder (approximately 183° C. for tin/lead solder) and above the de-bonding temperature of the underfill resin. Typically, the rework temperature must be above the solder reflow temperature, but less than about 220° C. depending on the circuit substrate. An average rework temperature would be about 200° C. The temperature can be higher if localized heat is used; for example, in an alternate embodiment, a chip bonder could be used to remove chips from a substrate post-bonding. In still another embodiment, the underfill may also include a B-staged thermoset that will de-polymerize at an elevated temperature.

Suitable thermoplastic resins include phenoxy, acrylic, methacrylic, polycarbonate, polyamides, polybutene, polyesters and some polyolefins. It is noted that the underfill does not need to be melted, rather, it is only necessary for the underfill to soften for de-bonding. Desirable polymers for use as thermoplastic underfill materials include thermoplastic die attach adhesives available from Alpha Metals under the trade name Staystik. Such materials can be de-bonded cleanly at elevated temperatures. Thus, when such materials are used, the thermoplastic film can be pealed away from both the chip and the circuit at elevated temperatures, leaving no residue.

Alternatively, the underfill can be made from a resin that is known to debond when a specific solvent is applied. One such resin system is a temporary attach adhesive available from Alpha Metals under the trade name Staystik 393. Underfills made with Staystik can be modified to contain a low expansion inorganic filler, preferably, a spherically-shaped silica of about 5 to about 15 microns in diameter. In order to achieve the desired coefficient of thermal expansion (CTE) close to that of tin/lead solder (22.5 ppm/deg. ° C.), the underfill should comprise about 60–70% by weight silica and about 20–30% resin. Note that one advantage of using Staystik 393 is that it does not dissolve, but does debond in the presence of alcohol, thereby providing a system by which any residue can be easily removed.

An underfill made with resins of the type described above would allow the underfill to debond by adding alcohol around the chip site. That notwithstanding, however, the solder joints would still have to be heated to solder reflow temperatures to allow the chip to be removed.

Although either one of the flux or the underfill may be applied to the bumped chip first, it is preferred that the flux be applied prior to application of the underfill. This is because the surface energy properties of the interface between the bumps and the underfill can cause the underfill to creep up the side of the bump, thereby covering it entirely. This effect is undesirable because the underfill becomes positioned between the solder bump and the pad onto which the solder is intended to contact, thereby causing the underfill to act as a contaminent. To address this situation, flux is applied to the bumps first. In one preferred method, a dip-transfer process using a reservoir of flux paste can be used. This process is as described below.

Figure 2A:
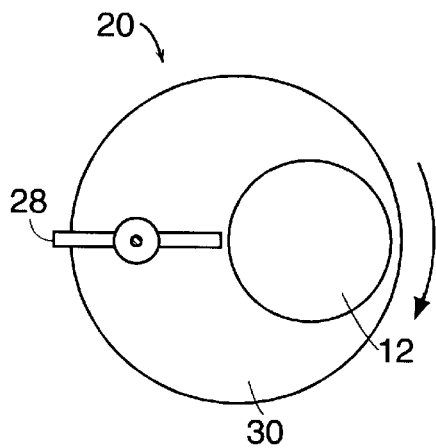
FIGS. 2A and 2B are schematic depictions of an apparatus for providing a flux coating on solder bumps.
Figure 2B:
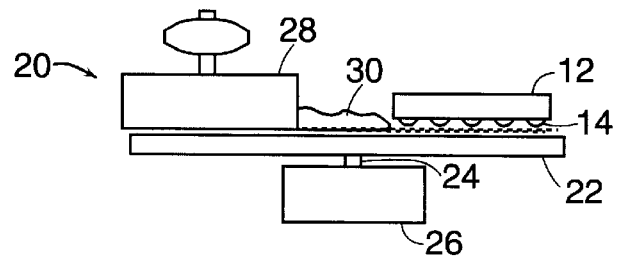

FIG. 1 depicts a flip chip assembly 10 which comprises a wafer 12 having solder bumps 14 on its surface. Flux may be provided on the bumps 14 by means of the apparatus and process depicted in FIGS. 2A and 2B. Specifically, FIG. 2A is a top view of a flux application apparatus, and FIG. 2B is a side elevational view of that apparatus. In FIGS. 2A and 2B, the flux application apparatus 20 comprises a rotating platen 22 which communicates via a spindle 24 with a drive motor 26. A doctor blade 28 which may be adjusted to provide a gap of a predetermined distance above the platen is mounted on one side. A flux paste 30 is provided on the surface of the platen 22 upstream of the doctor blade 28. When the platen 22 is rotated, the flux paste 30 is forced into the gap between the doctor blade 28 and the platen surface 22, thereby causing the flux paste downstream of the doctor blade 28 to be at a predetermined and desired thickness. In one embodiment, it is preferred that the thickness of the flux paste 30 downstream of the doctor blade 28 is less than that of the height of each bump 14 above the wafer 12. The wafer is dipped into the reservoir of flux paste as can be seen in FIGS. 2A and 2B. Since the depth of the flux paste 30 is less than the height of the solder bumps 14, only a portion of the bumps will become coated with the flux. Alternate flux coating methods include screen printing, roll coating and tampo printing since only the tops of the bumps need to be coated.

Figure 3:
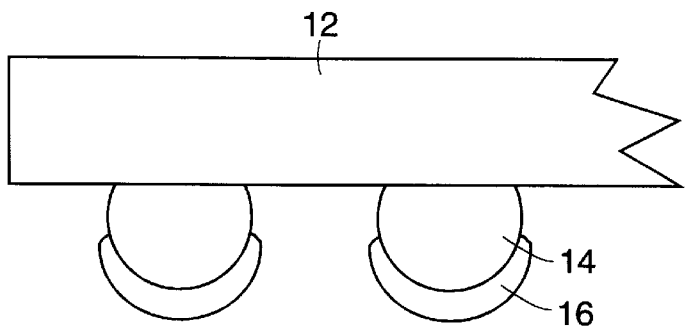
FIG. 3 is a schematic elevation of a flip chip having solder bumps, each such bump having a flux coating thereon.

FIG. 3 depicts a bumped wafer that has been provided with flux in the manner shown in FIGS. 2A and 2B. Specifically, FIG. 3 shows a wafer 12 having solder bumps 14 thereon. On each bump is a flux coating 16 which covers a portion of the bump. Once each bump 14 has been provided with a flux coating 16, the flux can be hardened by drying. As noted above, one preferred flux is a solid version of an epoxy/carboxylic acid type of flux commercially available as Chip Flux 20/20. The flux is dissolved in a solvent and provided with a wetting agent such as FC430, formerly available from Minnesota Mining and Manufacturing Co., or Fluowet, a low surface tension surfactant available from Hoechst-Celanese, to provide the deposited flux with a low surface energy.

Figure 4:
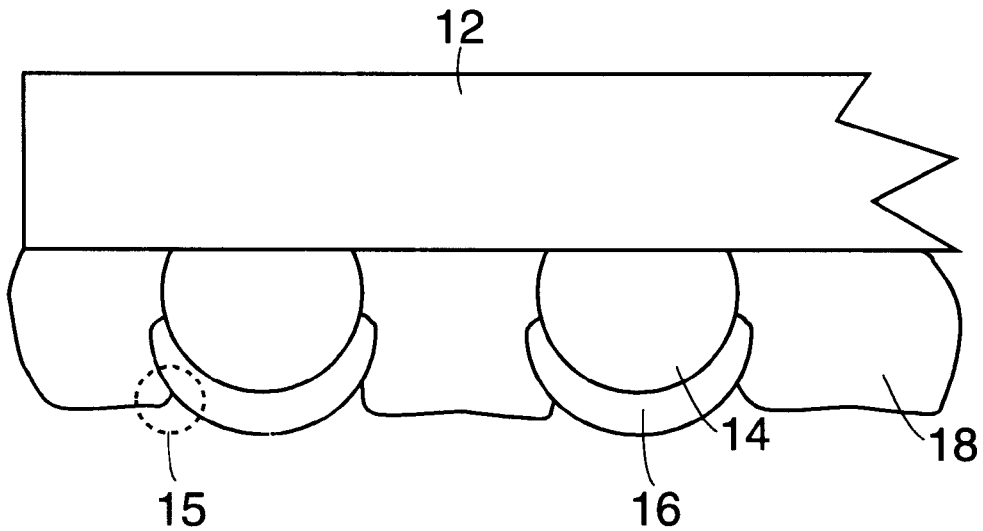
FIG. 4 is a schematic elevation of the device of FIG. 3 having an underfill material applied between the solder bumps.

After the solder bumps 14 have been provided with a flux coating 16, the spaces on the wafer surface between the solder bumps 14 are provided with an underfill in the liquid phase. The liquid underfill is applied to the wafer by spin coating, screen printing, or any of the common methods for applying liquids to surfaces. The resulting device is depicted in FIG. 4. Specifically, FIG. 4 shows a wafer 12 having solder bumps 14 each having a flux coating 16. The underfill material 18 is deposited on the wafer 12 in the spaces between the solder bumps 14. Since the flux coating 16 has a low surface energy, the underfill 18 does not become a coating over the flux 16. This is because surface chemistry principles require that wetting will only occur if the surface energy of the liquid (i.e., the underfill 18) is lower than that of the solid surface (i.e., the flux coating 16). Since the materials are selected such that the flux liquid has a higher surface energy than the flux coating, a receding contact angle results at the interface between the flux coating 16, the underfill 18, and the surrounding air. This is shown at region 15 of FIG. 4. Even though the underfill 18 may not wet the dried flux coating 16, the flux coating will still readily wet the bond pads on the circuit board to which the wafer is applied. This is a result of the effect that, when heat is applied, the flux coating 16 melts and becomes a liquid with a low surface energy. Again, since the flux liquid will have a lower surface energy than the bond pads, the flux liquid readily wets them. In addition, if desired, the flux coating 16 can be provided with various wetting additives such as the aforementioned FC430 or Fluowet. Alternatively a silicone such as Silwet L-77 available from Union Carbide could be employed.

Figure 5:
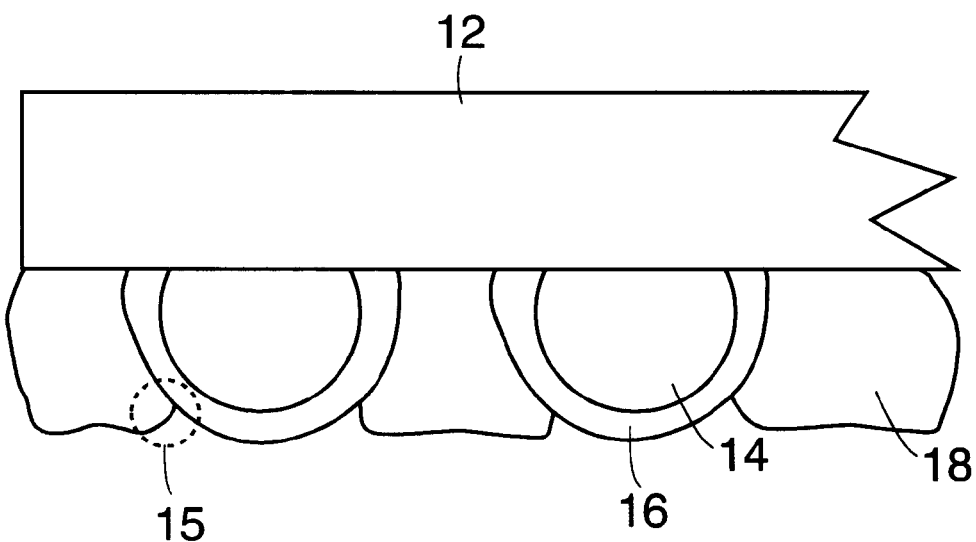
FIG. 5 is a schematic elevational view of an alternative embodiment of FIG. 4 in which the flux coating entirely surrounds each solder bump.

In an alternative embodiment shown in FIG. 5, the flux coating 16 may be applied to the solder bumps 14 in a manner such that it entirely covers them. Upon heating for the purpose of soldering the chip to the circuit board, the flux will melt and readily wet the bond pads. The softened underfill, being a thermoplastic material, will flow in around the bump as the flux flows away. As such, any residual flux will not act as a contaminant having a tendency to reduce adhesion.

EXAMPLES

Flux was made by blending the following with a high speed dispersing mixer:

Flux Sample 1

50 wt % PMA solvent (1-methoxy-2-propyl acetate); from Dow
45 wt % EPON 1001F (Bisphenol A Epoxy); Shell
3 wt % Succinic Anhydride, Lonza
2 wt % Thixatrol ST (thickener); from Rheox Flux Sample 2

Same mix as above but 0.1 to 0.5 wt % wetting agent (FC430 or Fluowet OTN) was added to reduce any tendency of the underfill to wet over the flux-coated bumps.

Flux Sample 3

45 grams PMA solvent 1-methoxy-2-propyl acetate); from Dow
48 grams EPON 1001F (Bisphenol A Epoxy); Shell
5 grams Adipic Acid, Aldrich Chemical
2 grams Thixatrol ST (thickener); from Rheox The resulting fluxes had viscosities of about 750 kcps. Viscosity can easily be adjusted by varying the amount of the thixotropic agent. A useful range for fluxes to be used in applications of the present invention is about 250 kcps to about 1,000 kcps.

Flux was applied to the bumps in each case by coating out the flux onto a glass plate so that the flux thickness was 2 to 3 mils. The flip chips were dipped into the flux and removed with flux clinging to the bumps. The flux was dried by placing the chip upright in an oven at about 150° C. for about 5 minutes. It is expected that this process will also work on a wafer.

Flux/Underfill Sample 4

Staytik 383 paste (no filler) was dispensed onto the bumped side of the chip with a syringe and allowed to flow out before drying in a vacuum oven at about 70° C. for about 30 minutes. The dry film thickness was less than the bump height. Bumps that were coated with flux containing the low surface tension wetting agent gave the best results with little or no underfill remaining on top of the bumps. Although soldering can still occur even with underfill on top of the bumps, the best results occur when only flux coats the upper bump surfaces.

Test Set 1

Flip chips, only coated with the three fluxes described above and no underfill, were used in the first set of tests intended to confirm good flux action. Each flux-coated chip was placed with bumps down onto a 1" diameter copper disk that was not pre-cleaned and therefore had a tarnished appearance. The samples were placed on a hot plate at about 216° C. for about 3 minutes. The flux and solder bumps melted causing the chip to attach to the copper. The copper became shiny in the areas contacted by the flux.

Samples were also run through an Electrovert Atmos 2000 convection oven with a peak temperature of approximately 220° C. It was found that the chips were soldered to the copper upon removal from the oven.

Test 2

Flip chips coated with both flux and underfill were run through the Electrovert oven at about 216° C. peak temperature. Solder joints formed at the copper interface and the underfill also bonded.

Equivalents

From the foregoing detailed description of the specific embodiments of the invention, it should be apparent that a unique flip chip having an integrated flux and underfill has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. A method for making an integrated circuit assembly for mounting on a circuit board which comprises:
   a) providing a substrate having a plurality of solderable contact sites on a surface thereof;
   b) positioning a plurality of solder bumps on the substrate such that each of the solderable contact sites has one solder bump associated therewith;
   c) affixing each solder bump to its associated contact site;
   d) applying a flux material to the solder bumps in a manner such that at least a portion of each solder bump is provided with flux; and
   e) applying an underfill material to the surface of the substrate in a manner such that it occupies a space defamed between each of the solder bumps and is of a depth such that at least a flux covered portion of each solder bump extends therethrough, and wherein steps (a)–(e) are performed prior to mounting the integrated circuit assembly on the circuit board.

2. The method for making an integrated circuit assembly of claim 1 wherein the substrate comprises a semiconductor wafer.

3. The method for making an integrated circuit assembly of claim 1 wherein the flux covers substantially all of each solder bump.

4. The method for making an integrated circuit assembly of claim 1 wherein the flux comprises an epoxy resin and a material selected from the group consisting of carboxylic acids, anhydrides and combinations thereof.

5. The method for making an integrated circuit assembly of claim 1 wherein the underfill material is reworkable.

6. The integrated circuit assembly of claim 1 wherein the flux material further comprises a low expansion filler.

7. The method for making an integrated circuit assembly of claim 2 wherein the substrate comprises a semiconductor chip.

8. The method for making an integrated circuit assembly of claim 7 wherein the substrate comprises a flip chip.

9. The method for making an integrated circuit assembly of claim 5 wherein the underfill material comprises a thermoplastic material.

10. The method for making an integrated circuit assembly of claim 9 wherein the thermoplastic material is selected from the group consisting of phenoxy resins, acrylic resins, methacrylic resins, polycarbonate resins, polyamide resins, polybutene resins, polyester resins, polyolefin resins and mixtures thereof.

11. A method for affixing a flip chip to a circuit board which comprises the steps of:
   a) providing a printed circuit board having a plurality of solderable contact sites on a surface thereof;
   b) providing an integrated circuit chip having a plurality of solderable contact sites on a surface thereof, each solderable contact site on the integrated circuit chip having a corresponding solderable contact site on the surface of the printed circuit board, the integrated circuit chip further characterized in that it includes:
      1) a plurality of solder bumps positioned on the integrated circuit chip such that each of the solderable contact sites located on the surface of the integrated circuit chip has one solder bump associated therewith, the solder bumps being affixed to the solderable contact sites;
      2) a flux material which covers at least a portion of each solder bump; and
      3) an underfill material applied to the surface of the substrate, the underfill material occupying a space defined between each of the solder bumps and being of a depth such that at least a flux covered portion of each solder bump extends therethrough, wherein the flux material and the underfill material are applied to the substrate prior to affixing the integrated circuit chip on the circuit board
   c) positioning the integrated circuit chip relative to the printed circuit board such that each solder bump is in contact with a solderable contact site on the printed circuit board;
   d) heating the integrated circuit chip to a temperature sufficiently high to melt the solder and the underfill material; and
   e) allowing the solder and underfill material to solidify.

12. The integrated circuit assembly of claim 6 wherein the low expansion filler is silica.

* * * * *

UNITED STATES PATENT AND TRADEMARK OFFICE
CERTIFICATE OF CORRECTION

PATENT NO. : 6,265,776 B1
DATED : July 24, 2001
INVENTOR(S) : Ken Gilleo

It is certified that error appears in the above-identified patent and that said Letters Patent is hereby corrected as shown below:

Column 2,
Line 57, change the word "underfll" to -- underfill --.

Column 9, claim 1,
Line 59, change the word "defamed" to -- defined --.

Signed and Sealed this

Eleventh Day of December, 2001

Attest:

*Nicholas P. Godici*

NICHOLAS P. GODICI
*Attesting Officer*   *Acting Director of the United States Patent and Trademark Office*